United States Patent
Monahan et al.

Patent Number: 5,677,488
Date of Patent: Oct. 14, 1997

[54] PIEZOELECTRIC FILM TRANSDUCER SYTEM FOR BEARINGS

[75] Inventors: Russell E. Monahan, Ann Arbor; Kevin J. Fontenot, Ypsilanti, both of Mich.

[73] Assignee: NTN Corporation, Osaka, Japan

[21] Appl. No.: 557,905

[22] Filed: Nov. 14, 1995

Related U.S. Application Data

[63] Continuation of Ser. No. 283,956, Aug. 1, 1994, abandoned.

[51] Int. Cl.⁶ .................................................. G01M 13/04
[52] U.S. Cl. .............................. 73/593; 73/660; 340/682; 340/683
[58] Field of Search .............................. 73/593, 560, 661, 73/587, DIG. 4; 340/680, 682; 364/683, 550

[56] References Cited

U.S. PATENT DOCUMENTS

| | | |
|---|---|---|
| 3,095,730 | 7/1963 | Matheson . |
| 3,208,268 | 9/1965 | Tallian et al. . |
| 3,303,452 | 2/1967 | Booth . |
| 3,699,806 | 10/1972 | Weichbrodt . |
| 3,750,127 | 7/1973 | Ayers et al. .................. 73/DIG. 4 |
| 3,948,089 | 4/1976 | Shaw et al. .................. 73/DIG. 4 |
| 4,117,719 | 10/1978 | Schütz ........................... 73/DIG. 4 |
| 4,145,930 | 3/1979 | Hildebrandt et al. ............ 73/593 |
| 4,237,454 | 12/1980 | Meyer . |
| 4,481,819 | 11/1984 | Yoneyama et al. . |
| 4,665,393 | 5/1987 | Wilder et al. . |
| 4,666,315 | 5/1987 | Scranton . |
| 4,672,850 | 6/1987 | Konersmann . |
| 4,689,992 | 9/1987 | Strachan ......................... 73/505 |
| 4,768,380 | 9/1988 | Vermeiren et al. . |
| 4,833,360 | 5/1989 | Holly .............................. 73/642 |
| 5,001,931 | 3/1991 | Nishimoto et al. . |
| 5,042,309 | 8/1991 | Kitamura ....................... 73/862.49 |

FOREIGN PATENT DOCUMENTS 0903729  2/1982  U.S.S.R. ............................ 73/593

OTHER PUBLICATIONS

Cohen et al., Piezoelectric Effect in Oriented Polyvinylchloride and Polyvinylfluroide, Jan. 1971.

*Primary Examiner*—Hezron E. Williams
*Assistant Examiner*—Nashmiya Ashraf
*Attorney, Agent, or Firm*—Harness, Dickey & Pierce, PLC

[57] ABSTRACT

An in-use rolling element bearing monitoring system which uses a piezoelectric film transducer on either a bearing, bearing support structure, or on a separate washer in close proximity to a bearing for monitoring bearing performance. One embodiment provides a bearing monitoring system for detecting and predicting bearing failure. Another embodiment provides a system configured for detecting rotational speed of a rolling element bearing. Each embodiment of the invention entails maintaining a piezoelectric film transducer in contiguous pressure wave responsive communication with a bearing for detecting bearing performance, and provides the system in a compact configuration for in-use operation on a variety of machinery and vehicle components heretofore previously not compatible.

18 Claims, 3 Drawing Sheets

PIEZOELECTRIC FILM TRANSDUCER SYTEM FOR BEARINGS

CROSS REFERENCE TO RELATED APPLICATION

This is a continuation application of U.S. patent application Ser. No. 08/283,956, filed Aug. 1, 1994 now abandoned.

FIELD OF THE INVENTION

This invention relates generally to bearing sensors and more particularly to a piezoelectric film transducer for a rolling element bearing for detecting and predicting bearing failure, or alternatively, for detecting rotational speed of a bearing.

BACKGROUND OF THE INVENTION

One previously known way of detecting faults and defects in a rolling element bearing involves removing the bearing from its operating environment and remounting the bearing in a test apparatus which is instrumented to detect periodic vibration signals which are produced by flaws in the bearing as it is rotated. Typically, velocity sensitive pickups or vibration pickups are used for detecting these vibration signals. However, the instrumentation and sensor necessary for performing these tests are frequently too cumbersome and too expensive for in-use testing of the bearing while it is mounted in its operating environment, for example, on a machine. Furthermore, a machine mounted bearing is typically exposed to additional external vibrations produced by the operating machine which complicate or prevent detection of bearing vibrations resulting from internal damage.

U.S. Pat. Nos. 4,237,454; 4,481,819, and 4,672,850 disclose various devices for monitoring rotating equipment such as gears and bearings which use piezoelectric ceramic or crystal transducers. The '454 patent utilizes a cantilever beam in conjunction with a piezoceramic element to form a tuned mechanical resonator, or vibrating reed, wherein the reed generates power which is used to detect defects as well as power transmitting circuitry when detecting malfunctioning of rotating machinery. The '819 patent utilizes a piezoelectric ceramic transducer to detect metal wipe of a plane bearing used in rotating machinery. However, an ultrasonic signal which is produced is then converted to a pulse signal through signal conditioning with a filter, amplifier, detector, and comparator. The '850 patent utilizes a piezoelectric transducer mounted on a ring which is then provided on a headstock of a gear wheel to evaluate the running quality of a gear system. However, each of the preceding piezoelectric transducer systems involve assemblies which are bulky and which do not provide streamlined attachment to bearing assemblies or structures, and thereby severely limit their point of application, as well as their resulting success.

Furthermore, previous attempts have utilized a standard accelerometer which produces noisy output and requires extensive electronic filtering in order to detect the presence of bearing damage. The noisy output results when an accelerometer senses mechanical vibration in a system by indirectly monitoring forces created from the rapid acceleration of a spring-mass system which generates forces proportional to the amplitude and frequencies of vibrations. Hence, force is applied to a sensing element which produces a charge that is proportional to mechanical motion. As a result, accelerometers tend to pick up considerable amounts of unwanted noise, and tend to be limited in their range of frequency.

SUMMARY OF THE INVENTION

In accordance with the present invention, an in-use monitoring system for rolling element bearings is provided in which a piezoelectric film transducer is retained on the bearing, bearing support structure, or on a separate component mechanically coupled to the bearing in order to monitor a bearing's performance. In one embodiment, the bearing monitoring system is configured to detect and predict bearing failure. In another embodiment, the system is configured to detect rotary speed of a rolling element bearing. A significant feature of the invention is the configuration of piezoelectric film transducers about a bearing, or mechanically coupled to a bearing, to detect bearing failure or damage, while providing the same in a compact configuration suitable for in-use operation on machinery and vehicle components. To date, all previous systems have been limited in their ability to provide compact bearing monitoring, particularly for bearings mounted in space-limited support structures which require that circumferential pressure waves be monitored on the bearing's outer circumference.

More specifically, the present invention contemplates an apparatus for predicting roller bearing failure in a rolling element bearing where pressure wave induced elastic deformation is detected in the bearing or support structure with a strategically placed piezoelectric transducer or group of transducer(s). To differentiate background noise from the sensed bearing failure signal, either the transducer signal is compared to a threshold value which indicates a normal bearing, or signals produced by a number of transducers are compared by cancelling out common mode noise between the signals.

Objects, features and advantages of this invention are to provide a piezoelectric film transducer system for bearings which can be configured to detect and predict bearing failure, or sense bearing speed, and which provides the preceding in a compact and effective sensor system which is of simplified design and economical manufacture and assembly, is easy to implement on large or small bearings, and can be configured on a separate disk or ring which can be installed with the bearing.

Further objects, features and advantages of the invention will become apparent from a consideration of the following description and the appended claims when taken in connection with the accompanying drawings.

DETAILED DESCRIPTION OF THE PREFERRED EMBODIMENT

Figure 1:
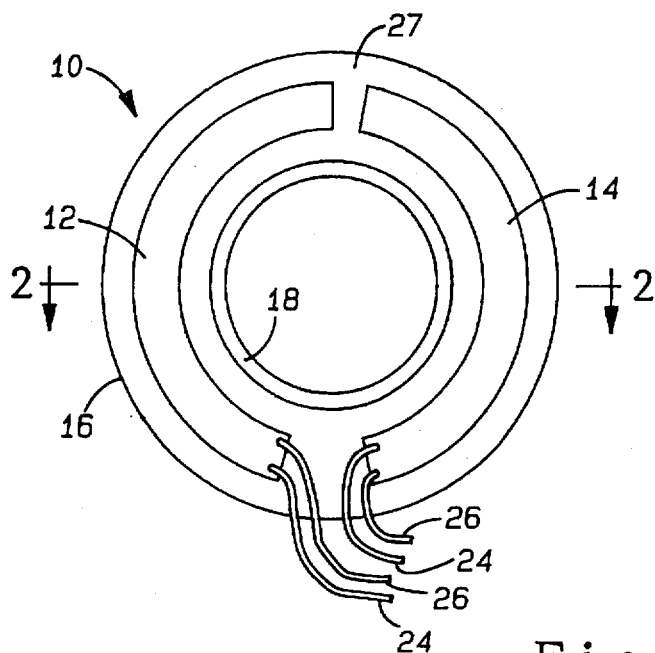
FIG. 1 is a plan view of a bearing vibration sensor with a pair of piezoelectric film transducers adhesively retained to the back face of a bearing race in accordance with a preferred embodiment of this invention.
Figure 2:
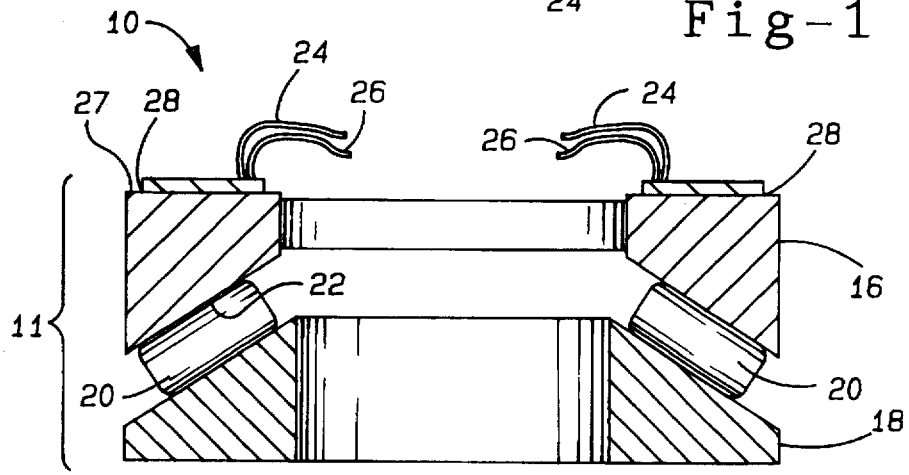
FIG. 2 is a cross-sectional view taken along line 2—2 of FIG. 1 showing the arrangement of the bearing and sensor.

Referring in more detail to the drawings, FIGS. 1 and 2 depict a tapered roller bearing and bearing sensor assembly 10 incorporating features of the present invention. Assembly 10 is provided with a pair of piezoelectric film transducers 12 and 14 which are retained on a bearing outer race 16 to provide bearing sensing. A typical bearing is formed by assembling the outer race 16, an inner race 18, and a plurality of rolling elements. A spall 22, or defect, which forms in either one of the races or either of the rolling elements will grow to produce impact-induced pressure waves which travel through the bearing. By retaining each transducer 12 and 14 in contiguous pressure wave coupling with the wheel bearing, or the structure supporting the bearing, pressure wave-induced strain can be sensed and monitored to detect and predict bearing failure. Alternatively, cyclical loads which are caused by the bearings as they rotate between the races can be monitored in order to measure bearing rotational velocity.

Preferably, each transducer 12 and 14 is formed from piezoelectric film which is cut in a semi-circular configuration. Alternatively, a plurality of smaller piezoelectric transducers, or a single ring-shaped transducer can be retained along the bearing surface. Each piezoelectric transducer has a positive lead 24 and negative lead 26 affixed to opposite sides of the film which produce an electrically conductive output in relation to stresses imparted on the film.

Furthermore, each piezoelectric film transducer 12 and 14 is preferably bonded to a backface 27 on outer race 16 with an epoxy adhesive 28. It is important when mounting each piezoelectric film transducer to a bearing or bearing structure that contiguous pressure wave coupling is obtained between the sensor and bearing structure. The electrical output transmitted by leads 24 and 26 is related to the rigidity with which each sensor is retained to the bearing. When adhesively captivating each transducer to the bearing, the best adhesives appear to be based on acrylic, epoxy, urethane and cyanoacrylate polymers. These adhesives offer the best method of transferring mechanical pressure waves into the film.

As depicted in FIGS. 1 and 2, the two semi-circular sensors, or transducers, 12 and 14 are adhesively attached on backface 27 180° apart. In this arrangement, common mode noise as measured through leads 24 and 26 will cancel out when using an electronic circuit, such as a differential circuit, to subtract one wave from the other. The resulting output shows damage spikes more clearly over bearing and external noise present in each transducer output. In applications where the load on the bearing is stationary with respect to outer race 16, one of the transducers 12 or 14 would be located in the "load zone" whereas the outer is opposite that area. This configuration enhances rejection of noise.

Rigid adhesive captivation of transducers 12 and 14 directly to the bearing 10 provides a method of determining the presence of bearing damage. Bearing damage, for example due to a spall 22, causes mechanical vibration and begins as a mechanical pressure wave traveling through the bearing and surrounding housing. The pressure wave begins when the applied load on a bearing causes a rolling element 20 to deflect into a void created By a spall 22. Alternatively, damage debris which forms in the bearing or other contaminants causes pressure waves as rolling element 20 contacts the debris. The resulting pressure waves travel through the bearing system and elastically deform the bearing material at a high frequency. Bearing damage can thus be detected by using a transducer to sense the physical change caused by the traveling pressure wave.

Preferably, the piezoelectric transducers 12 and 14 are based on highly polar poly-vinylidene fluoride film which proves economical for use directly in a bearing or on a bearing structure. This film which is presently commercially available under the name Piezo Film from AMP Sensors, Inc., of Valley Forge, Pa., has properties which show extremely wide frequency range, as well as a broad dynamic response, making it ideal for bearing applications. Physically, the film is a flexible plastic which can be easily cut and adhered to a substrate in order to form intricate transducers at a relatively low cost. Additionally, the film allows a very flexible packaging when incorporating the sensors on a bearing structure. Furthermore, a broad dynamic range is available with the sensor.

As a general principle, piezoelectric materials are anisotropic. Therefore, their electrical and mechanical responses differ depending on the axis of applied mechanical stress or strain. Additionally, piezoelectric film is inherently capacitive. Hence, signals generated by the film always differentially change with time. Furthermore, the film's frequency characteristics differ vastly from those of ceramic transducers. For example, piezoelectric film has very wide band characteristics, near D.C. to 10 GHz. A flat frequency response over a wide frequency range results partially from the polymers softness, as opposed to the hardness of ceramics. A basic half wavelength resonance frequency of 28 micrometer piezoelectric film is about 40 MHz. Due to the anisotropic properties of piezoelectric materials, it is preferable to orient the film on a bearing such that pressure waves traveling through the bearing are maximally measured. In order to facilitate such placement, two basic types of piezoelectric film are available.

A homo-polymer piezoelectric film is preferably utilized in the assembly 10 due to its inherent flexibility and low cost. Homo-polymer film works primarily in a "stretch mode", for stresses induced parallel to the crystalline orientation of the film surface. Homo-polymer films work by sensing pressure waves produced around the bearing as it is dynamically deformed about its neutral axis by any bearing damage with which it is in contact.

In contrast, co-polymer films are alternatively utilized and are generally more sensitive than homo-polymer films. Co-polymer films work principally in a compressive mode. This film is most sensitive to forces applied perpendicular to the face of the film. Output, for example from leads 24 and 26, is proportional to forces which strain the material through its thickness. Preliminary laboratory bearing tests have shown this film to work quite well at sensing damage. A major drawback to this film is its high cost and brittle properties. Furthermore, the copolymer price can be from 2 to 10 times that of the homo-polymer depending on the thickness of the film. Furthermore, the co-polymer film has proven to be difficult to install without incurring damage to the film. However, this problem is not an issue when the film is packaged in a suitably designed and assembled production bearing unit.

The bearing pressure wave detection system depicted by assembly 10 consists of a pair of components in operation. First, the assembly 10 provides a bearing sensor incorporated into a bearing package or into a system which uses bearings. Secondly, electronics are provided which determine if there is damage to the bearing by monitoring output from leads 24 and 26 on each transducer. In its simplest form, this electronic output can be fed to a simple indicator light or trip switch which is activated at a threshold value indicating the onset of bearing damage. Alternatively, a more sophisticated module can be devised for recording electrical output from leads 24 and 26 which is transmitted to a central command center and which is further processed to extract sensed bearing damage from extraneous bearing and machinery noise.

As depicted in FIGS. 1 and 2, the bearing and sensor assembly 10 can be used to sense a bearing's internal damage in heavy equipment, such as in axle bearings, final drives, or transmissions. Catastrophic failure can be prevented which could lead to further damage of other parts in a machine system including gears and other bearings. As a result, down-time for a damaged piece of heavy equipment is substantially decreased. Previous systems have proven difficult or impossible to package, especially in a cost effective and efficient manner, and furthermore, in limited space applications.

Further applications are apparent in the aerospace industry where wheel bearings on landing gear of commercial aircraft are presently routinely removed and inspected to determine if there exists bearing damage. Installation of bearing assemblies 10 would potentially reduce present maintenance requirements. Such information could be obtained while an aircraft is taxiing on a runway. This information could be further passed to a ground crew which would determine further inspection and maintenance action.

A third application is apparent for monitoring axle bearings on railroad cars which would serve to limit derailments caused by bearing failures.

Figure 3:
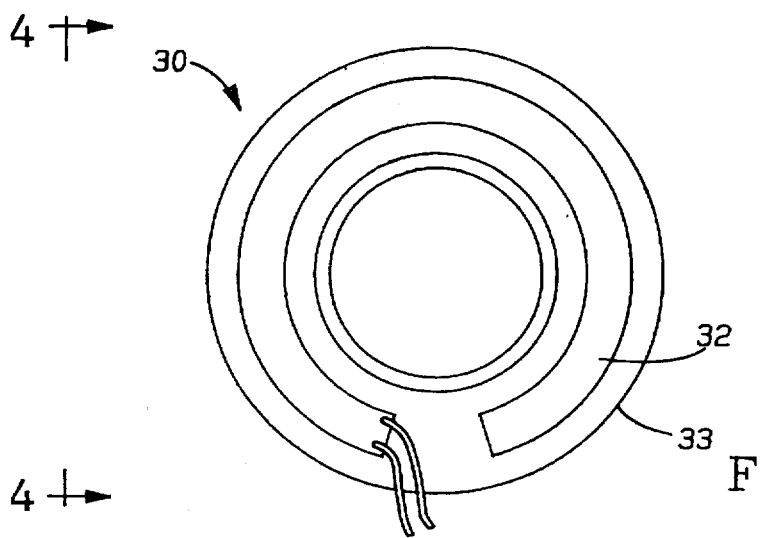
FIG. 3 is a plan view of a bearing vibration sensor packaged on a flat washer in accordance with a second embodiment of this invention which provides an interchangeable washer sensor for use with bearings that can be easily replaced without replacing the sensor.
Figure 4:
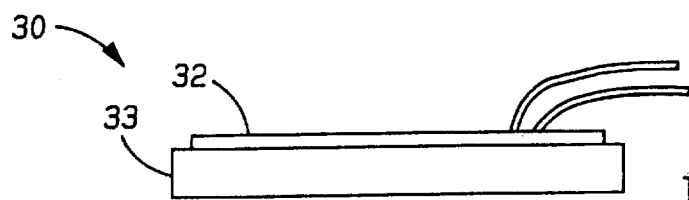
FIG. 4 is a side elevational view taken along line 4—4 of FIG. 3.

FIGS. 3 and 4 illustrate a washer bearing sensor assembly 30 which provides a circumferential piezoelectric film transducer 32 on a washer 33 for sensing pressure waves. The assembly is retained in contiguous pressure wave coupling with a bearing or bearing support structure to monitor and predict bearing failure of a rolling element bearing, or measure rotational speed of a bearing in accordance with a second embodiment of this invention. The washer sensor assembly provides a separate flat washer configuration which can be packaged with various sized bearings in a multitude of applications by retaining the washer in rigid communication with either a bearing inner or outer race, or a bearing support structure. Such a package facilitates modification of an existing bearing in order to monitor the bearing performance without modifying the actual bearing. Alternatively, the washer configuration further facilitates interchangeable use of a single washer with a multitude of bearings. Furthermore, the flat washer can be adhesively bonded to a bearing race in order to increase contiguous pressure wave coupling therebetween. Such a system provides a rigid washer attachment to a bearing which can still be removed through use of an adhesive solvent. For example, the aforementioned embodiment depicted in FIGS. 1 and 2 using a pair of piezoelectric film transducers can be alternatively formed with the separable washer.

Figure 5:
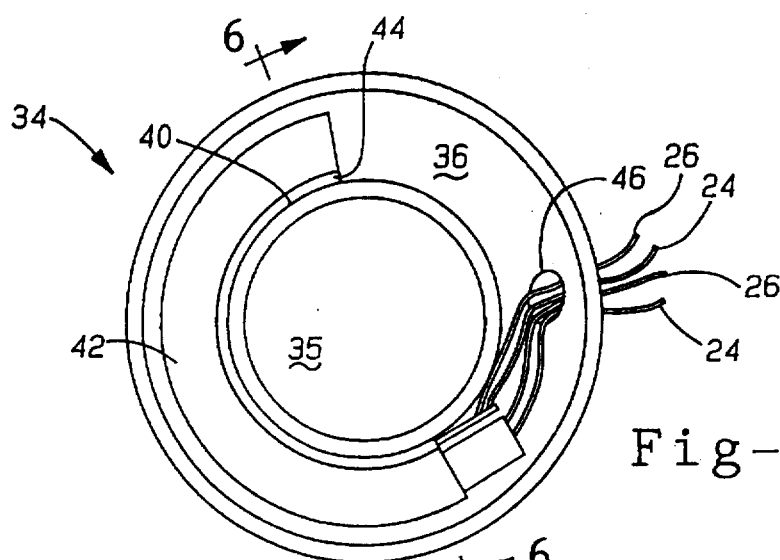
FIG. 5 is a plan view of a sensor hub cup mounted on a stub shaft of an automotive wheel hub annular speed sensor system in accordance with a third embodiment of this invention.
Figure 6:
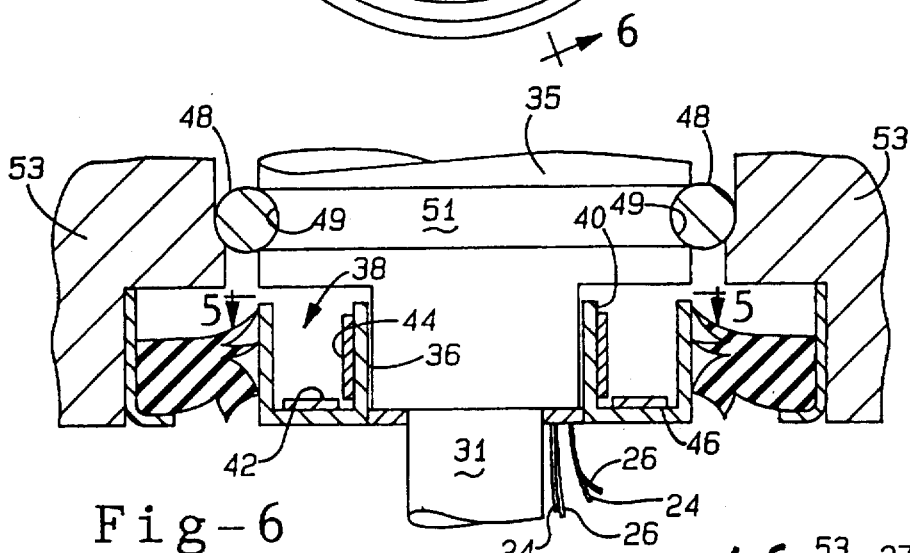
FIG. 6 is a cross-sectional view taken along line 6—6 of FIG. 5 showing the sensor hub cup mounted to an automotive wheel hub annular speed sensor system.

FIGS. 5 and 6 depict an automotive wheel hub bearing sealing system 34 with a stationary stub shaft 35 or inner race pressed onto the stub shaft and a hub cup 36 for carrying piezoelectric film transducers, or sensor rings, 42 and 44 in accordance with a third embodiment of this invention. The first sensor ring is a crescent-shaped piezoelectric film transducer 42 which is adhesively retained in a trough bottom 38 formed in hub cup 36. Likewise, or alternatively, a circumferential-shaped piezoelectric film transducer 44 is adhesively retained to an inner diameter wall 40 on the hub cup 36. A transducer wire port 46 is formed in hub cup 36 through which positive and negative leads 24 and 26 exit from transducers 42 and 44.

In assembly, hub cup 36 is mounted to the stub shaft 35 or pressed onto the inner raceway of the bearing which is in turn pressed onto the stub shaft, which receives ball bearings 48 in a raceway 49 to define an inner race 51. An outer race 53 retains the bearings such that the outer race rotates about the stationary inner race. In assembly, the hub cup and bearing inner race are rigidly retained together through fasteners or press fitting to obtain contiguous pressure wave coupling therebetween. Vibration induced pressure waves communicate from the rolling element 48 and raceway 51 into the stub shaft or inner race 35, hub cup 36, and transducers 42 and 44 which sense and measure bearing rotational speed through known signal characteristics produced by rotation of rolling elements within the bearing, or alternatively monitor bearing failure. Alternatively, where background noise is not a problem, just one of the transducers 42 or 44 is necessary.

Figure 7:
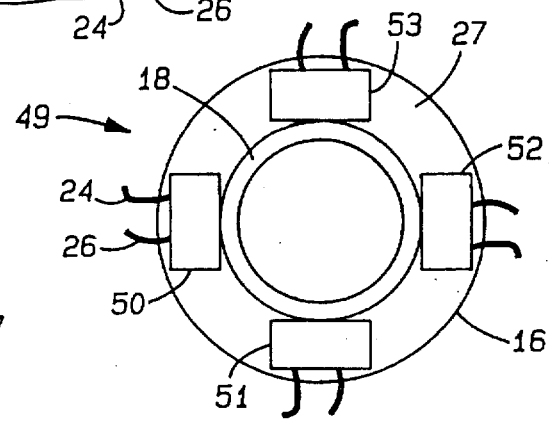
FIG. 7 is a plan view of a bearing vibration sensor with four piezoelectric film transducers adhesively retained to the back face of a bearing race in accordance with a fourth embodiment of this invention.

FIG. 7 illustrates an alternative configuration, or fourth embodiment 49, for the bearing sensor 10 depicted in FIGS. 1 and 2, wherein four piezoelectric film transducers 50, 51, 52 and 53 are arranged circumferentially spaced apart 90° about a backface 27 of a bearing outer race 16. Preferably, copolymer film is utilized due to its increased sensitivity to forces applied perpendicular to the film face. However, copolymer film is brittle and in this application is susceptible to breakage during handling and testing. It is felt that this brittleness should not pose a problem when incorporated in a refined production assembly operation. In fact, transducer placement on an outer race backface with copolymer film as shown in FIGS. 1, 2, and 7 appears to be the most likely position for use in a production design. Furthermore, this arrangement is most suitable for sensing rotary speed of a bearing with the aforementioned transducers.

Figure 8:
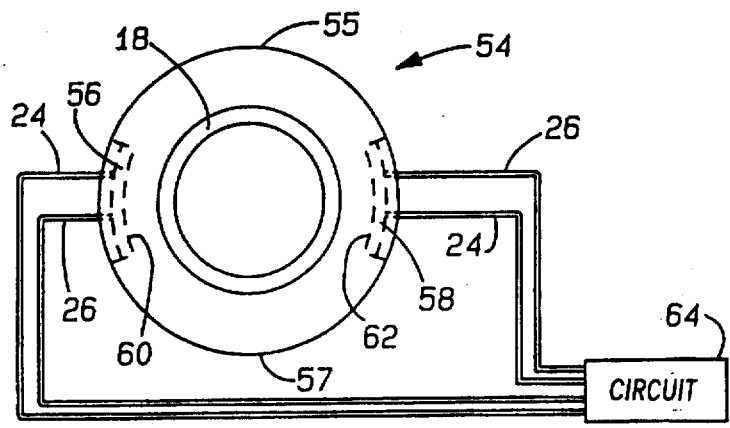
FIG. 8 is a plan view of a bearing vibration sensor with a pair of piezoelectric film transducers adhesively retained in shallow ground-in recesses in the outer circumference of a bearing outer race in accordance with a fifth embodiment of this invention.

FIG. 8 illustrates a roller bearing and sensor system 54 similar to that depicted in FIGS. 1, 2 and 7 which retains a pair of piezoelectric film transducers 56 and 58 in shallow receptacles 60 and 62 formed in a circumferential outer surface 57 of the bearing's outer race 55. Preferably, each receptacle is ground into a circumferential surface of the bearing outer race to form a very shallow recess for receiving the film. As a result, a bearing can be received in a circumferential support cavity of a bearing support structure in a manner which does not contact and load the film. By carefully forming the receptacle, the strength of the bearing outer race is only nominally affected. Such a device allows for outer circumferential attachment of transducers to the outer diameter of a race which only nominally causes deformation due to the modification. Preferably, this configuration utilizes a copolymer film. Furthermore, a readily commercially available comparative electronic circuit 64 is utilized to cancel noise from transducers 56 and 58 by subtracting their outputs. Alternatively, circuit 64 can be a threshold activated trip switch having an indicator light triggered by comparison of either sensor output with a threshold output via a comparator.

Figure 9:
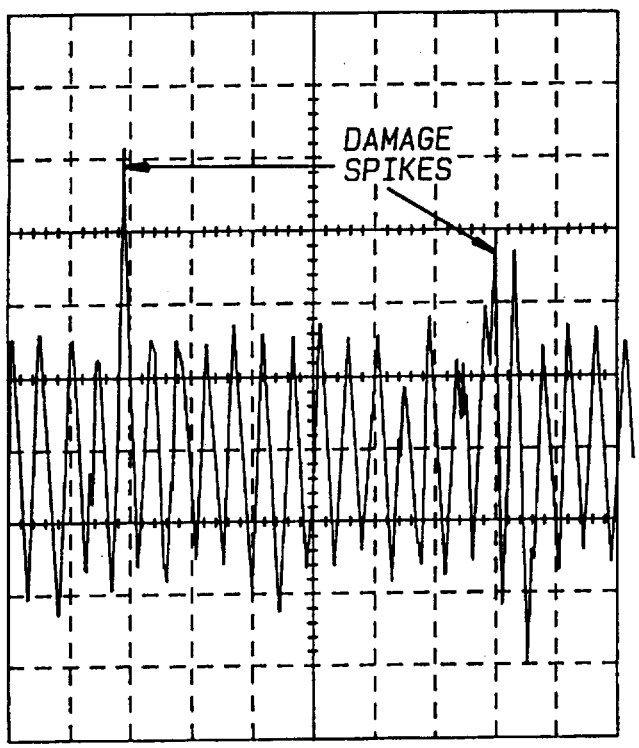
FIG. 9 shows a plot of sensor test results when a defect exists in a rolling element in the bearing assembly of FIG. 7.

FIG. 9 depicts plotted sensor test results for the bearing and sensor assembly 10 shown in FIG. 7 when subjected to a 21,000 lb. thrust load under a rotating condition at 930 RPM's. As denoted in the plot, large voltage, or damage, spikes are present which are superimposed over generally sinusoidal waves. The sinusoidal waves are formed by rollers as they pass over the area of a piezoelectric sensor. In this particular test, an NTN 72487 bearing was run on a rolling contact fatigue test machine. From the plot, each resulting large voltage spike is proportional to the load and severity of damage of the bearing tested. For this test, a damaged NTN 72487 tapered roller bearing which had been run to induce fatigue damage prior to testing was used, and piezoelectric film was attached which is available from AMP Sensors, INC., Valley Forge, Pa.

Figure 10:
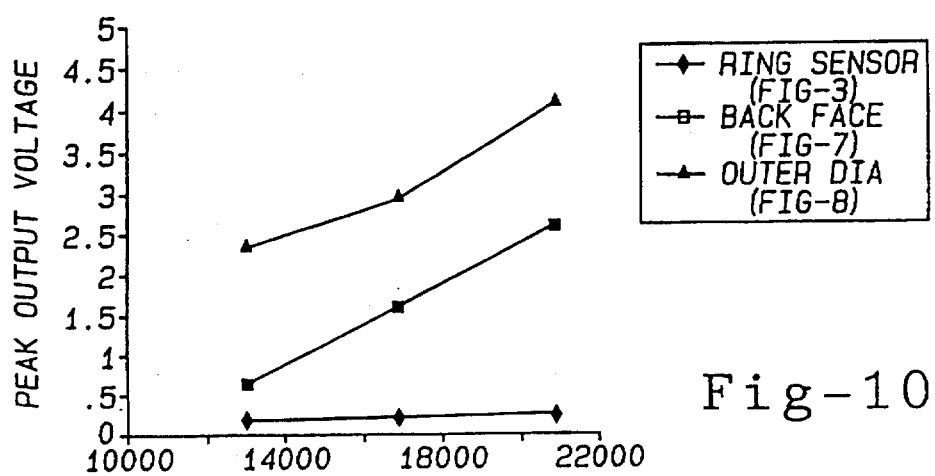
FIG. 10 shows a graph of peak voltage spikes from a series of sensed signals such as the one shown in FIG. 9 versus bearing thrust load, for the embodiments depicted in FIGS. 3, 7, and 8.

Finally, FIG. 10 shows a graph of peak voltage spikes, such as that shown in FIG. 9, versus bearing thrust load from a sensed signal for each of the bearing configurations depicted in each of the three embodiments shown in FIG. 3, FIG. 7, and FIG. 8, respectively. It is apparent from FIG. 10 that the amplitude of the detected voltage spike is fairly linear with respect to load for each of these three embodiments of the invention. This relationship may be further used in order to predict and determine the severity of damage, as well as the total load on a given bearing.

It is to be understood that the invention is not limited to the exact construction illustrated and described above, but that various changes and modifications may be made without departing from the spirit and scope of the invention as defined in the following claims.

We claim:

1. A monitoring system for in-use monitoring of a rolling element bearing in order to detect pressure waves generated in said bearing as a result of bearing damage and to detect pressure waves generated in said bearing as a result of bearing rotational speed, said monitoring system comprising:

said rolling element bearing having a support structure and a plurality of rolling elements;

at least two piezoelectric film transducers coupled to said support structure of said bearing on opposing sides thereof, said transducers receiving and sensing pressure waves generated by said rolling elements in said bearing, said transducers being mechanically responsive to said pressure waves generated within said bearing and said transducers being operable to output corresponding electrical signals in response to said pressure waves; and detecting means for monitoring said electrical signals and for detecting a specific pressure wave recurring over intervals of time indicative of bearing damage and for detecting a specific pressure wave recurring over intervals of time indicative of rotational speed, said detecting means including electronic circuit means for comparing an electrical signal from one of said transducers with an electrical signal from another of said transducers, said circuit operable to cancel out common background noise in said signals by subtracting said signals from one another thereby resulting in signal spikes indicative of bearing damage and rotational speed when generated.

2. The system of claim 1 wherein said pressure wave indicative of bearing damage is detected with said transducers via said detecting means to predict bearing failure by comparatively monitoring said signals from said transducers with a reference value indicating normal bearing operation and signaling when output deviates from said reference value.

3. The system of claim 1 wherein said support structure is formed by an inner race of said bearing.

4. The system of claim 1 wherein said support structure is formed by an outer race of said bearing.

5. The system of claim 3 wherein said bearing includes an axial face, said transducers being received on said axial face of said bearing.

6. The system of claim 3 wherein said bearing includes an outer circumferential surface, said transducers being received on said outer circumferential surface of said bearing.

7. The system of claim 1 further comprises a washer for receiving said transducers separate from said bearing, said washer being forcibly retained against said bearing so as to subject said transducers to said pressure waves.

8. The system of claim 1 wherein said detecting means comprises an electronic circuit means for differentiating bearing damage signals from background noise by comparatively monitoring said signals with a reference value so as to detect output deviation.

9. The system of claim 8 wherein said electronic circuit means comprises a trip switch electrically conductive with an indicator light, said light operable in response to a threshold sensed signal output comparatively monitored via a comparator.

10. The system of claim 5 wherein a mounting recess is provided in said axial face, said transducers being received in said mounting recess.

11. The system of claim 1 wherein one of said transducers is mounted in a load zone of said bearing and another of said transducers is mounted opposite said load zone.

12. The system of claim 1 wherein said transducers are formed from a piezoelectric polar poly-vinylidene fluoride film.

13. The system of claim 12 wherein said transducers are of a homopolymer.

14. The system of claim 12 wherein said transducers are of a copolymer.

15. The system of claim 1 wherein said at least two piezoelectric film transducers include a pair of semicircular piezoelectric film transducers provided circumferentially about said support structure, said transducers positioned generally opposite one another.

16. The system of claim 1 wherein said at least two piezoelectric film transducers include an array of four transducers provided circumferentially about said support structure, said transducers spaced generally equidistant apart.

17. The system of claim 1 wherein said transducers are adhesively bonded to said bearing.

18. The system of claim 6 wherein a mounting recess is provided in said outer circumferential surface, said transducers being received in said mounting recess.

* * * * *

UNITED STATES PATENT AND TRADEMARK OFFICE
CERTIFICATE OF CORRECTION

PATENT NO. : 5,677,488
DATED : 10/14/97
INVENTOR(S) : Russell E. Monahan, et al.

It is certified that error appears in the above-indentified patent and that said Letters Patent is hereby corrected as shown below:

Column 8, Line 6, Claim 2, after "of" delete "hearing" and insert --bearing--

Signed and Sealed this

Sixteenth Day of December, 1997

*Attest:*

BRUCE LEHMAN

*Attesting Officer*  *Commissioner of Patents and Trademarks*